(12) United States Patent
McArdle et al.

(10) Patent No.: US 9,893,154 B2
(45) Date of Patent: Feb. 13, 2018

(54) RECESS LINER FOR SILICON GERMANIUM FIN FORMATION

(71) Applicant: GLOBALFOUNDRIES INC., Grand Cayman (KY)

(72) Inventors: Timothy J. McArdle, Ballston Lake, NY (US); Judson R. Holt, Ballston Lake, NY (US); Junli Wang, Singerlands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/609,295

(22) Filed: May 31, 2017

(65) Prior Publication Data

US 2017/0294515 A1    Oct. 12, 2017

Related U.S. Application Data

(62) Division of application No. 15/095,376, filed on Apr. 11, 2016, now Pat. No. 9,698,226.

(51) Int. Cl.
| | |
|---|---|
| *H01L 21/00* | (2006.01) |
| *H01L 29/161* | (2006.01) |
| *H01L 27/092* | (2006.01) |
| *H01L 21/8238* | (2006.01) |
| *H01L 29/10* | (2006.01) |
| *H01L 29/66* | (2006.01) |
| *H01L 29/78* | (2006.01) |
| *H01L 29/04* | (2006.01) |

(52) U.S. Cl.
CPC .... *H01L 29/161* (2013.01); *H01L 21/823821* (2013.01); *H01L 27/0924* (2013.01); *H01L 29/045* (2013.01); *H01L 29/1054* (2013.01); *H01L 29/66795* (2013.01); *H01L 29/785* (2013.01)

(58) Field of Classification Search
CPC .......... H01L 29/161; H01L 21/823821; H01L 27/0924; H01L 29/045; H01L 29/1054; H01L 29/66795; H01L 29/785
See application file for complete search history.

(56) References Cited

U.S. PATENT DOCUMENTS

| | | | |
|---|---|---|---|
| 8,940,595 B2 | 1/2015 | Chandra et al. | |
| 9,450,095 B1 * | 9/2016 | Bergendahl | ......... H01L 29/7848 |
| 2014/0357060 A1 | 12/2014 | Liu et al. | |

\* cited by examiner

*Primary Examiner* — Nicholas Tobergate
(74) *Attorney, Agent, or Firm* — Scully Scott Murphy and Presser; Frank Digiglio

(57) ABSTRACT

Semiconductor device fabrication method and structures are provided having a substrate structure which includes a silicon layer at an upper portion. The silicon layer is recessed in a first region of the substrate structure and remains unrecessed in a second region of the substrate structure. A protective layer having a first germanium concentration is formed above the recessed silicon layer in the first region, which extends along a sidewall of the unrecessed silicon layer of the second region. A semiconductor layer having a second germanium concentration is disposed above the protective layer in the first region of the substrate structure, where the first germanium concentration of the protective layer inhibits lateral diffusion of the second germanium concentration from the semiconductor layer in the first region into the unrecessed silicon layer in the second region of the substrate structure.

7 Claims, 4 Drawing Sheets

RECESS LINER FOR SILICON GERMANIUM FIN FORMATION

This application is a divisional of U.S. patent application Ser. No. 15/095,376, filed Apr. 11, 2016.

FIELD OF THE INVENTION

The present invention relates to semiconductor devices and to methods for forming semiconductor devices, and more particularly, to fin-type field-effect transistors (FinFET) and methods of fabrication thereof.

BACKGROUND

Semiconductor devices, such as, fin-type field effect transistors, typically include a large number of transistors within a single chip or wafer area. As the integration density of transistors continues to increase, the footprint area occupied by individual transistors continues to decrease. This ever-decreasing transistor size can result in challenges to the performance characteristics of the transistors. These challenges include, for instance, dual channel devices caused by the diffusion of germanium from a region designated for a p-type field effect transistor (PFET) device into a region designated for an n-type field effect transistor (NFET) device, during the fabrication of silicon fins in the NFET region and silicon germanium fins in a PFET region, respectively.

Accordingly, enhancements in fin device structures and fabrication methods continue to be desired for enhanced performance and commercial advantage.

BRIEF SUMMARY

Certain shortcomings of the prior art are overcome and additional advantages are provided through the provision, in one aspect, of a method for forming a semiconductor device which includes, providing a substrate structure including a silicon layer at an upper surface of the substrate structure, the silicon layer being recessed in a first region of the substrate structure to define a recessed silicon layer, and unrecessed in a second region of the substrate structure to define an unrecessed silicon layer; forming a protective layer which includes a first germanium concentration, above the recessed silicon layer in the first region, the protective layer extending, at least in part, along a sidewall of the unrecessed silicon layer in the second region of the substrate structure, wherein the height of the protective layer extended along the sidewall of the unrecessed silicon layer is substantially equal to a height of the unrecessed silicon layer in the second region; and disposing a semiconductor layer which includes a second germanium concentration, directly above the protective layer in the first region, wherein the first germanium concentration of the protective layer inhibits lateral diffusion of the second germanium concentration from the semiconductor layer in the first region into the unrecessed silicon layer in the second region of the substrate structure. Further, an upper surface of the semiconductor layer disposed over the protective layer in the first region may be substantially coplanar with the upper surface of the unrecessed silicon layer in the second region of the substrate structure.

In a further aspect, a semiconductor device is provided which includes: at least one fin having a first conductivity extended above a substrate structure in a first region of the substrate structure, and at least one fin having a second conductivity extended above in a second region of the substrate structure, wherein a fin pitch of each of the at least one fin of the first region and the at least one fin of the second region is within a range from about 5 nm to about 50 nm.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
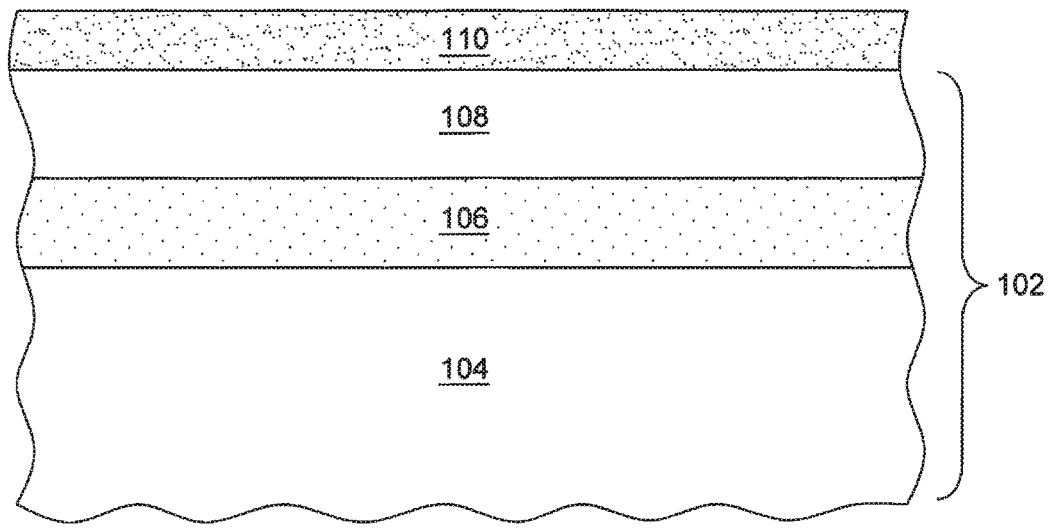
FIG. 1A depicts a cross-sectional elevational view of a structure obtained during a semiconductor device fabrication, and illustrating a substrate structure having a silicon layer at an upper portion of the substrate structure, and a protective substrate layer disposed over the substrate structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

The present disclosure provides, in part, semiconductor devices such as, fin-type field effect transistors including silicon fins of a NFET device and silicon germanium fins of a PFET device, respectively. In one aspect, as one skilled in art will understand, silicon fin(s) and silicon germanium fin(s), positioned on a common substrate structure, are traditionally employed in the fabrication of NFETs and PFETs, respectively. By way of an example, the fabrication of silicon germanium fins of a PFET device typically involves thermal diffusing of an epitaxially grown silicon layer and an epitaxially grown silicon germanium layer in a PFET region of the substrate structure. As the integration density of transistors transitions to 10 nm and beyond, the thermal diffusing of the silicon germanium layer in the PFET region results, for instance, in diffusion of germanium from a region designated for a p-type field effect transistor (PFET) device into a region designated for an n-type field effect transistor (NFET) device. Such diffusion of germanium could negatively impact performance of the resultant integrated circuits. Additionally, as the size of the technology nodes continues to decrease, such diffusion of germanium between the NFET region and the PFET region could also limit the proximity of the silicon fins of a NFET region and the silicon germanium fins of a PFET region, respectively, which, in turn, may not achieve desired circuit performance characteristics.

In one aspect of the present invention, there is disclosed a method for forming a semiconductor device which includes, for example, providing a substrate structure including a silicon layer at an upper portion of the substrate structure, the silicon layer being recessed in a first region of the substrate structure to define a recessed silicon layer, and remaining unrecessed in a second region of the substrate structure to define an unrecessed silicon layer; forming a protective layer including a first germanium concentration, above the recessed silicon layer in the first region of the substrate structure, the protective layer extending, at least in part, along a sidewall of the unrecessed silicon layer in the second region of the substrate structure, wherein the height of the protective layer extended along the sidewall of the unrecessed silicon layer is substantially equal to the height of the unrecessed silicon layer in the second region; and disposing a semiconductor layer including a second germanium concentration, above the protective layer in the first region of the substrate structure, wherein the first germanium concentration of the protective layer inhibits lateral diffusion of the second germanium concentration from the semiconductor layer in the first region into the unrecessed silicon layer in the second region of the substrate structure.

In one embodiment, the formation of the protective layer may include forming the protective layer with an increased thickness along the sidewall of the unrecessed silicon layer in the second region of the substrate structure, relative to a thickness of the protective layer formed over the recessed silicon layer in the first region of the substrate structure. For example, the protective layer may have a (110) crystal surface orientation along the sidewall of the unrecessed silicon layer in the second region of the substrate structure, and a (100) crystal surface orientation over the recessed silicon layer in the first region of the substrate structure.

In one implementation of the present invention, the providing of the substrate structure may include forming a protective substrate mask over a silicon layer of the substrate structure, and selectively exposing a portion of the silicon layer disposed at the upper surface of the substrate structure in the first region, and recessing the exposed silicon layer down from an upper surface of the protective substrate mask to form the recessed silicon layer at the upper portion of the substrate structure in the first region. For example, the formation of the protective layer may include epitaxially growing the protective layer contiguously along the sidewall of the unrecessed silicon layer of the second region of the substrate structure and over the recessed silicon layer in the first region of the substrate structure, with the protective layer being selective for a material of the unrecessed silicon layer and the recessed silicon layer. Further, each of the protective layer and the semiconductor layer may include, or be fabricated of, a silicon germanium alloy material, with the second germanium concentration of the semiconductor layer being higher than the first germanium concentration of the protective layer. The formation of the protective layer and the disposing of the semiconductor layer may occur within a same process chamber.

In another implementation of the present invention, the fabrication method may include thermally mixing the second germanium concentration of the semiconductor layer with the protective layer and, at least in part, the recessed silicon layer, without lateral diffusion of the second germanium concentration into the unrecessed silicon layer in the second region of the substrate structure. The thermal diffusion of the second germanium concentration consumes the protective layer disposed directly over the recessed silicon layer to form a treated semiconductor layer having uniform germanium concentration in the first region of the substrate structure. In this example, the thickness of the treated semiconductor layer in the first region of the substrate structure may be substantially equal to the thickness of the unrecessed silicon layer in the second region of the substrate structure. Further, the thermal diffusion of the second germanium concentration at least partially diffuses the second germanium concentration into the protective layer extending along the sidewall of the unrecessed silicon layer to form a graded protective layer. In such a case, the graded protective layer inhibits lateral diffusion of the second germanium concentration into the unrecessed silicon layer in the second region of the substrate structure. In this example, a thickness of the graded protective layer along the sidewall of the unrecessed silicon layer may define a fin pitch of the at least one fin in the first region of the substrate structure and at least one fin in the second region of the substrate structure.

In one aspect, the fabrication method may further include patterning a treated semiconductor layer to form at least one fin having a first conductivity in the first region of the substrate structure, and patterning the unrecessed silicon layer to form at least one fin having a second conductivity in the second region of the substrate structure, with the first conductivity being different than the second conductivity. In this example, each of the at least one fin in the first region of the substrate structure and the at least one fin in the second region of the substrate structure may have uniform fin pitch, with the uniform fin pitch being dependent, prior to the patterning, on a thickness of the protective layer extending along the sidewall of the unrecessed silicon layer in the second region of the substrate structure. For instance, the uniform fin pitch of the at least one fin in the first region of the substrate structure, and the at least one fin in the second region of the substrate structure may be within a range from about 5 nm to about 50 nm.

Reference is made below to the drawings, which are not drawn to scale for ease of understanding, wherein the same reference numbers used throughout different figures designate the same or similar components.

By way of example, FIGS. 1A-1G depict one embodiment of a method and the structure for forming a semiconductor device such as, fin-type field effect transistors including silicon fins of a NFET device and silicon germanium fins of a PFET device, respectively. Advantageously, as described below, an epitaxially grown protective layer inhibits diffusion of higher germanium concentration from the PFET device region to the NFET device region, in accordance with one or more aspects of the present invention.

FIG. 1A depicts a cross-sectional elevational view of a structure obtained during a fin-type transistor fabrication process, which includes, in one example, a substrate structure 102. Substrate structure 102 includes, for example, a semiconductor substrate 104 and an insulating substrate layer 106 disposed above semiconductor substrate 104. In one embodiment, semiconductor substrate 104 may be a bulk semiconductor material such as, for example, a bulk silicon wafer. In another embodiment, semiconductor substrate 104 may be any silicon-containing substrate including, but not limited to, silicon (Si), single crystal silicon (Si), polycrystalline Si, amorphous Si or the like. Semiconductor substrate 104 may in addition, or instead, include various isolations, dopings and/or device features. Optionally, substrate structure 102 may include, insulating substrate layer 106 which, for instance, may be, or include, a buried dielectric layer such as, for example, a buried oxide (BOX) layer, silicon-on-nothing (SON), silicon-on-insulator or the like. For instance, buried oxide layer 106 may be fabricated by employing SIMOX (Separation by Implanted Oxygen) technique which, for instance, may include implanting high doses of oxygen ($O^+$) ions into silicon substrate 104, and annealing at a high temperature to form a layer of buried oxide 106 over the silicon substrate 104. As one skilled in the art will understand, the fabrication of buried oxide layer 106 could result in a residual layer of semiconductor material 108 which, for instance, may include a silicon material, from the semiconductor substrate 104 to be disposed over the insulating substrate layer 106. This residual silicon layer 108 may be disposed, for instance, at an upper surface of the substrate structure 102. Although the thickness of the residual silicon layer may vary according to the processing node in which the semiconductor device is being fabricated, the thickness of the residual silicon layer 108 may be within a range from about 10 nm to about 100 nm.

Continuing with FIG. 1A, a layer of protective substrate mask 110 may be disposed over the substrate structure 102. For instance, protective substrate mask 110 may be, or include, a nitride material such as, for example, silicon nitride (SiN or $Si_3N_4$) or silicon oxynitride (SiON). In a specific example, protective substrate mask 110, having a thickness of about 1 nm to about 100 nm, may be deposited over silicon layer 108 of substrate structure 102 using any conventional deposition process, such as, chemical vapor deposition (CVD), physical vapor deposition (PVD), atomic layer deposition (ALD) or plasma-enhanced versions of such processes. Protective substrate mask 110, for example, may be provided to protect the underlying silicon layer from damage during subsequent etch processes, and depending upon the fabrication process, may also prevent silicon layer 108 of substrate structure 102 from being oxidized by exposure to an oxygen-containing environment during device fabrication.

Figure 1B:
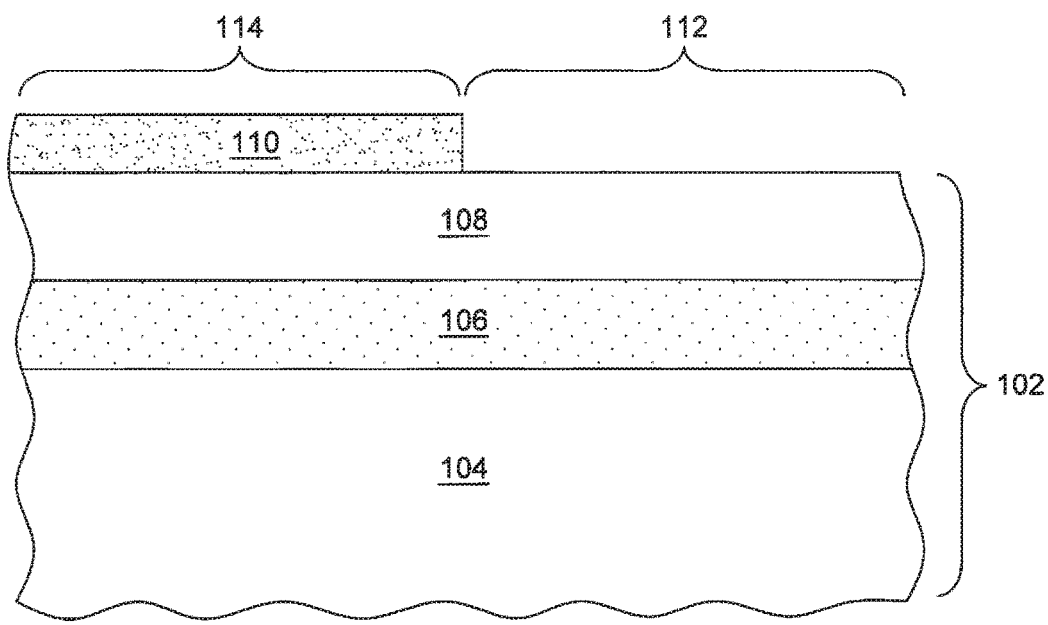
FIG. 1B depicts the structure of FIG. 1A, after selectively exposing the silicon layer of the substrate structure, in accordance with one or more aspects of the present invention.

FIG. 1B depicts the structure of FIG. 1A, after selectively exposing a portion of silicon layer 108 of the substrate structure 102, in accordance with one or more aspects of the present invention. For instance, one or more etch processes may be performed to remove protective substrate mask 110 to selectively expose a desired portion of silicon layer 108 of the substrate structure 102, thereby defining one or more regions, for example, region 112 and region 114 of the substrate structure 102, as depicted in FIG. 1B. As described further below, region 112 constitutes a PFET device region, upon which one or more silicon germanium fins can be formed for use with, for instance, the fabrication of a PFET device, and region 114 constitutes an NFET device region, upon which one or more silicon germanium fins can be formed for use with, for instance, the fabrication of a NFET device. In one example, the selective etch processes may be accomplished using one or more anisotropic dry etch process(es), such as, for instance, reactive ion etching (RIE) process or plasma etching. In a specific example, reactive ion etching may be performed using remote plasma involving process gases such as, nitrogen trifluoride ($NF_3$) and hydrogen ($H_2$). As depicted, the portion of silicon layer 110 of substrate structure 102 in region 114 remains protected by the protective substrate mask 110.

Figure 1C:
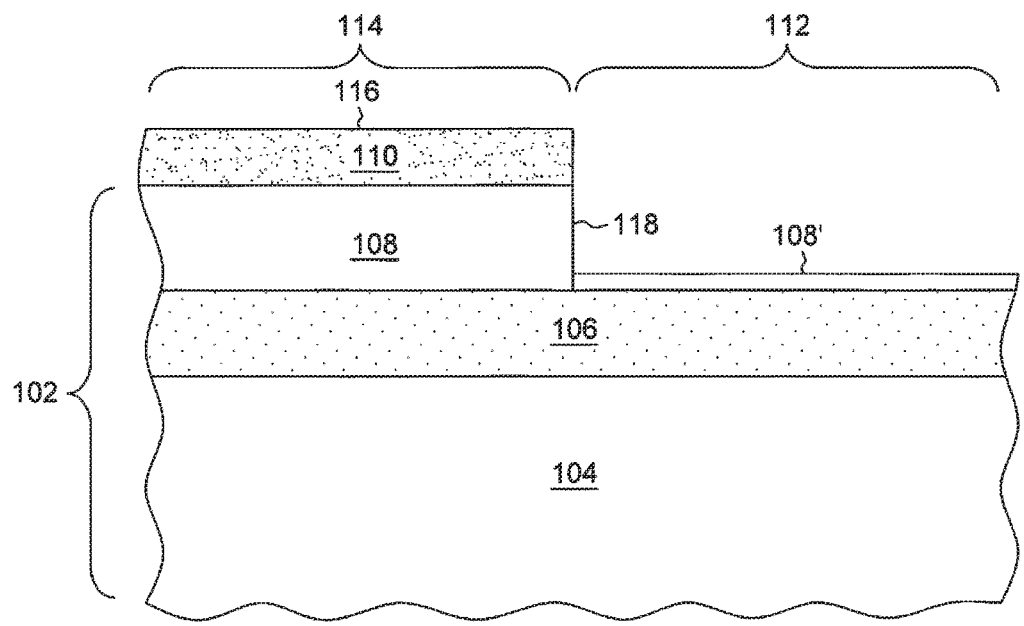
FIG. 1C depicts the structure of FIG. 1B, after recessing the silicon layer in a first region of the substrate structure, in accordance with one or more aspects of the present invention.

As depicted in FIG. 1C, one or more selective etch processes are performed to recess the exposed silicon layer 108 of the substrate structure 102, for instance, down from upper surface 116 of the protective substrate mask 110 in region 114, in accordance with one or more aspects of the present invention. For instance, the exposed silicon layer 108 may be selectively etched using one or more isotropic or anisotropic dry etching processes such as, reactive ion etching (RIE), and is etched to expose one or more sidewalls 118 of the unrecessed silicon layer 108 in region 114. In one example, the exposed silicon layer 108 may be recessed to a depth of about 10% to about 90% of the unrecessed silicon layer 108 in region 114. Assuming that the substrate structure is silicon-on-insulator (SOI) substrate, the recessing of the exposed silicon layer 108, for instance, results in a thin recessed silicon layer 108', for instance, having a thickness of about 2 nm to about 10 nm, over the insulating substrate layer 106 of the substrate structure 102. As depicted and discussed further below, in one embodiment, the exposed silicon layer 108 is recessed from upper surface 116 of the protective substrate mask 110 in region 114 for a desired depth which, for example, defines the height of one or more fins to be formed in regions 112 and 114 such that the resultant fins are co-planar with each other.

Figure 1D:
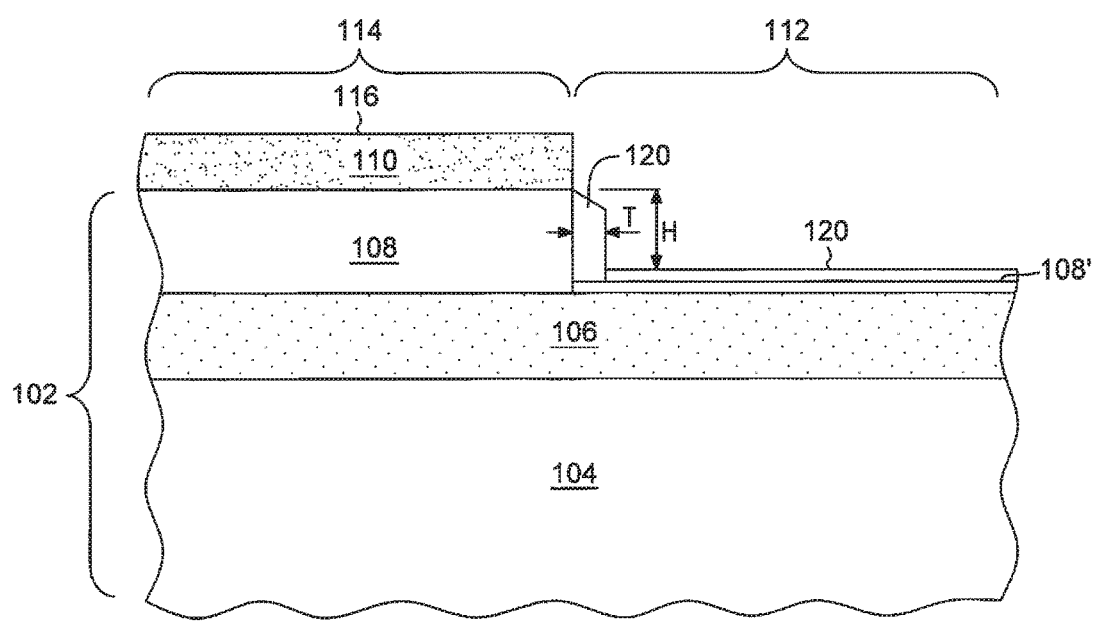
FIG. 1D depicts the structure of FIG. 1C, after forming a protective layer having a first germanium concentration, over the recessed silicon layer in the first region of the substrate structure, in accordance with one or more aspects of the present invention.

FIG. 1D depicts the structure of FIG. 1C, after forming a protective layer 120 over recessed silicon layer 108' in region 112 of substrate structure 102. The protective layer 120, in one embodiment, may be epitaxially grown as a contiguous layer over the recessed silicon layer 108' in region 112, and extended along the sidewall 118 of the unrecessed silicon layer 108 in region 114. As used herein, "epitaxially growing/growth" refers to the orderly growth of a semiconductor material over a surface of another semiconductor material, such as, recessed silicon layer 108' of region 112 and unrecesed silicon portion 108 of region 114, where the grown material arranges itself in the same crystal orientation as the underlying material. The protective layer 120, for instance, may include, or be fabricated of, an undoped or in-situ doped semiconductor material such as, for instance, silicon germanium alloy, having an atomic concentration of about 0% to about 25% of germanium concentration disposed therein. The protective layer 120 may be epitaxially grown using selective epitaxial growth via various methods such as, for example, rapid thermal chemical vapor deposition (RTCVD), low energy plasma deposition (LEPD), ultra-high vacuum chemical vapor deposition (UHCVD), atmospheric pressure chemical vapor deposition (APCVD), molecular beam epitaxy (MBE) and the like. In one example, the epitaxial growth process of the protective layer 120 may be accomplished within a reduced pressure epitaxy chamber using a silicon precursor gas such as, silane ($SiH_4$), dichlorosilane ($SiH_2Cl_2$), trichlorosilane ($SiHCl_3$), silicon tetrachloride ($SiH_4$), disilane ($Si_2H_6$); a germanium precursor gas such as $GeH_4$, and $Ge_2H_6$ or combinations thereof, at an operating pressure of about 50 T to about 400 T, and at a temperature of about 500° C. to about 750° C. A carrier gas such as, for instance, $H_2$, $N_2$, He, Ar, or a combination thereof, and one or more etchant gases such as, hydrochloric acid (HCl) may also be introduced into the epitaxy process chamber along with the silicon and germanium precursor gases. Optionally, when the protective layer 120 is an in-situ doped semiconductor material, a dopant gas which, for example, may be, or may include, at least one of a p-type dopant (for example, $B_2H_6$) or an n-type dopant (for example, phosphine ($PH_3$), arsine ($AsH_3$) or stybine ($SbH_3$)) may also be introduced into the process chamber. In a specific example, the concentration of n-type dopants or p-type dopants disposed within the in-situ doped protective layer 120 may be less than about 1E19 atom/$cm^3$. The epitaxial growth of protective layer 120 is selective for the semiconductor material of unrecessed silicon layer 108 of region 114 and recessed silicon layer 108' of region 112. As one skilled in the art will understand, "selective" in this context means that the epitaxial growth of the protective layer 120 occurs preferentially over the semiconductor material of regions 112 and 114, without occurring over the protective substrate mask 110 which, in one example, is a nitride material.

Further, and in one embodiment, the epitaxial growth process of the protective layer 120 may be accomplished by modulating the process parameters, such as, for example, pressure, source gases and/or temperature, to facilitate forming the protective layer 120 within an increased thickness "T" along the sidewall 118 (see FIG. 1D) of unrecessed silicon layer 108 of region 114, relative to the thickness of the protective layer 102 disposed over recessed silicon layer 108' of region 112. By way of an example, as described above, the epitaxial growth process performed using silicon precursor gases, such as, for instance, dichlorosilane ($SiH_2Cl_2$), silane ($SiH_4$) or the like, and germanium precursor gases, such as, for instance, germane ($GeH_4$), in the presence of etching gases such as, hydrochloric acid (HCl), at a temperature from about 550° C. to about 750° C., and at a pressure within a range from about 100 T to about 400 T, results in the protective layer 120 having an increased thickness T along the sidewall 118 of the unrecessed silicon layer 108 in region 114 with, for instance, a facetted upper surface, as depicted in FIG. 1D. In one example, protective layer 120 may have a thickness of about 1 nm to about 10 nm over recessed silicon layer 108' in region 112, and a thickness of about 2 nm to about 20 nm along the sidewall 118 (see FIG. 1C) of the unrecessed silicon layer 108 in region 114.

Further, in one example, assuming that the silicon substrate wafer has a planar (100) crystallographic surface orientation, the protective layer 120 may have a (110) crystallographic surface orientation along the sidewall 118 (see FIG. IC) of the unrecessed silicon layer 108' of region 114, and a (100) crystallographic surface orientation over the recessed silicon layer 108' of region 112. Still further, in one embodiment, as depicted in FIG. 1D, the protective layer 120 extended along the sidewall 118 (see FIG. 1C) of the unrecessed silicon layer 108 may have a height "H" that is substantially equal to the height of the unrecessed silicon layer 108 in region 114. As used herein, "substantially" refers to the height of the protective layer 120 extended along the sidewall 118 (see FIG. 1C) of the unrecessed silicon layer 108 being equal to the height of the unrecessed silicon layer 108 in region 114, although the heights may locally vary. This, in turn, results in inhibiting and/or minimizing the lateral diffusion of higher germanium concentration from the overlying semiconductor layer, as described below in connection with FIG. 1E.

Figure 1E:
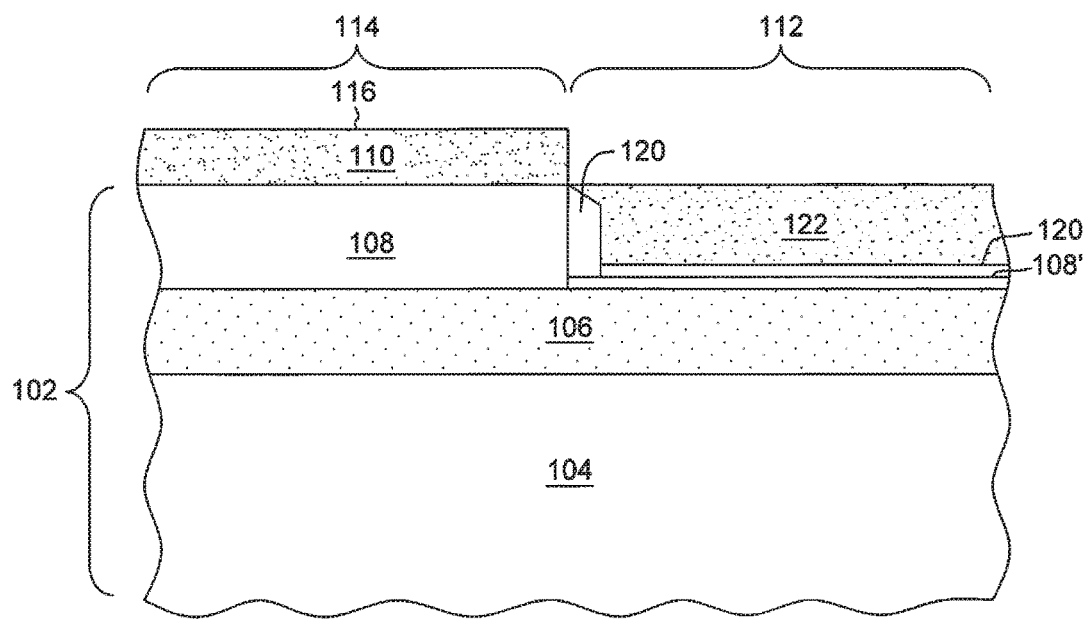
FIG. 1E depicts the structure of FIG. 1D, after disposing a semiconductor layer having a second germanium concentration, above the protective layer in the first region of the substrate structure, in accordance with one or more aspects of the present invention.

FIG. 1E depicts the structure of FIG. 1D, after disposing a semiconductor layer 122 above the protective layer 120 in region 112 of the substrate structure 102, in accordance with one or more aspects of the present invention. The semiconductor layer 122, for instance, may include, or be fabricated of, a semiconductor material such as, for instance, silicon germanium alloy, having an atomic concentration of about 20% to about 100% of germanium concentration disposed therein, and may be epitaxially grown using any of the semiconductor precursor gases (for example, silicon precursor gases, germanium precursor gases) and the epitaxial growth techniques employed in the epitaxial growth of protective layer 120, as described above in connection with FIG. 1D. As depicted, the thickness of the semiconductor layer 122 may be (in one example) sufficient to allow an upper surface of semiconductor layer 122 to be coplanar with an upper surface of unrecessed silicon layer 108 of region 114, although the thickness of the semiconductor layer 122 may vary locally. Further, in one embodiment, the protective layer 120 and the semiconductor layer 122 may advantageously be formed or provided in a common process chamber by sequentially employing the process parameters such as, pressure, source gases and/or temperature suitable for the formation of the protective layer 120 and then modifying the process parameters suitably to form the semiconductor layer 122. Such modification of the process parameters advantageously results in the semiconductor layer 122 having higher atomic concentration of germanium concentration than that of the protective layer 120.

Figure 1F:
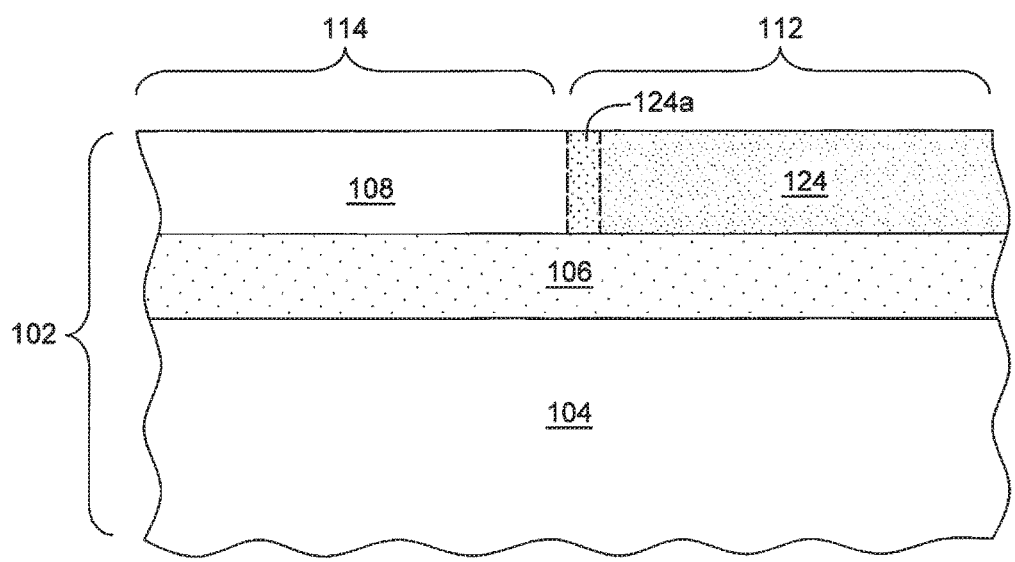
FIG. 1F depicts the structure of FIG. 1E, after thermal diffusion of the second germanium concentration of the semiconductor layer in the second region of the substrate structure, in accordance with one or more aspects of the present invention

As depicted in FIG. 1F, the structure may be subjected to one or more annealing processes to facilitate diffusing the germanium concentration from the semiconductor layer 122 (see FIG. 1E) into the underlying protective layer 120 (see FIG. 1E) and the recessed silicon layer 108' (see FIG. 1E) of region 112. As noted, the annealing process performed to thermally diffuse the germanium concentration from the semiconductor layer 122 (see FIG. 1E) into protective layer 120 (see FIG. 1E) and the recessed silicon layer 108' (see FIG. 1E) results in consuming the protective layer disposed over the recessed silicon layer 108', thereby forming a treated semiconductor layer 124 having a uniform germanium concentration, in region 122 (see FIG. 1E) of substrate structure 102. Note that, in the depicted figure, the treated semiconductor layer 124 collectively refers to the resultant layers of the semiconductor layer 122 (see FIG. 1E), protective layer 120 (see FIG. 1E) and the recessed silicon layer 108'(see FIG. 1E), after the diffusion processing step. For instance, the uniform germanium concentration of the treated semiconductor layer 124 may be approximately equal to the germanium concentration of the semiconductor layer 122 (see FIG. 1E). The annealing process may be performed using, for instance, furnace annealing, rapid thermal anneal, flash anneal or the like. In one example, the annealing process may be performed using a furnace annealing process at a temperature from about 800° C. to about 1200° C., in the presence of an inert gas such as, Argon (Ar), helium (He) or nitrogen ($N_2$) for a time period of about 10 mins to 2 hrs, depending on the anneal temperature. Alternatively, the thermal diffusing of the germanium concentration between the semiconductor layer 122 (see FIG. 1E), protective layer 120 (see FIG. 1E) and the recessed silicon layer 108' (see FIG. 1E) may also be accomplished during any conventional annealing processes such as, for instance, gate oxidation annealing process, rapid thermal annealing process during subsequent processing, without an additional annealing step.

In one implementation, assuming the substrate structure 102 includes a silicon-on-insulator (SOI) substrate, the recessed silicon layer 108' (see FIG. 1E) disposed over insulating substrate layer 106 (see FIG. 1E) may also be consumed along with the protective layer 120 (see FIG. 1E) to form the treated semiconductor layer 124 of region 112. In this example, the thickness of the treated semiconductor layer 124 of region 112 may be substantially equal to the thickness of the unrecessed silicon layer 108 of region 114. Although the thickness of the treated semiconductor layer 124 may vary according to the technology node in which the semiconductor device is being fabricated, in a specific example, the thickness of the treated semiconductor layer 124 may be from about 10 nm to about 100 nm. As used herein, the term "substantially" in this context refers to the thickness of the treated semiconductor layer 124 being equal to the thickness of the unrecessed silicon layer 108 of region 114, although the thickness may vary locally. In another implementation, although not depicted in the figures, one skilled in the art will understand that when the substrate structure 102 includes a bulk silicon substrate, the recessed silicon layer 108' may not be completely consumed during the thermal diffusing of the germanium concentration between the semiconductor layer 122 (see FIG. 1E), protective layer 120 (see FIG. 1E) and the recessed silicon layer 108' (see FIG. 1E). In such a case, the treated semiconductor layer 124, having a thickness from about 10 nm to about 100 nm, may reside over the bulk silicon substrate.

Further, and in one embodiment, the thermal diffusion of the germanium concentration between the semiconductor layer 122 (see FIG. 1E), protective layer 120 (see FIG. 1E) and the recessed silicon layer 108' (see FIG. 1E) facilitates, for instance, partial diffusion of the germanium concentration from the semiconductor layer into the protective layer 120 (see FIG. 1E) extending along the sidewall of the unrecessed silicon layer. This, in turn, results in a graded protective layer 124a being formed along the sidewall 118 (see FIG. 1C) of the unrecessed silicon layer 108 of the substrate structure 102. As used herein, "graded" refers to a portion of the protective layer in which the concentration of germanium concentration has a gradient, i.e., decreases along a direction of the lateral diffusion (that may vary locally). As one skilled in the art will understand, the graded protective layer 124a inhibits and/or minimizes the lateral diffusion of the germanium concentration from the semiconductor layer 122 into the unrecessed silicon layer 108. The thickness of the graded protective layer 124a may be substantially similar to the thickness of the protective layer 120 disposed along the sidewall of the unrecessed silicon layer 108 of region 114. For example, the graded protective layer 124a may have a thickness within a range of about 0 nm to about 10 nm. Further, as described below, the thickness of the graded protective layer 124a, for instance, defines a fin pitch of two adjacent fins to be patterned in region 112 and region 114, upon subsequent patterning processing. As used herein, "fin pitch" refers to the distance between two fins measured from, for example, a middle point of one fin to a middle point of an adjacent fin.

Continuing with FIG. 1F, a non-selective chemical mechanical polish or an etch-back polish may be performed to remove the protective substrate mask 110 disposed over the unrecessed silicon layer 108 of region 114, using (in one embodiment) the upper surfaces of treated semiconductor layer 124 of region 112, as an etch stop.

Figure 1G:
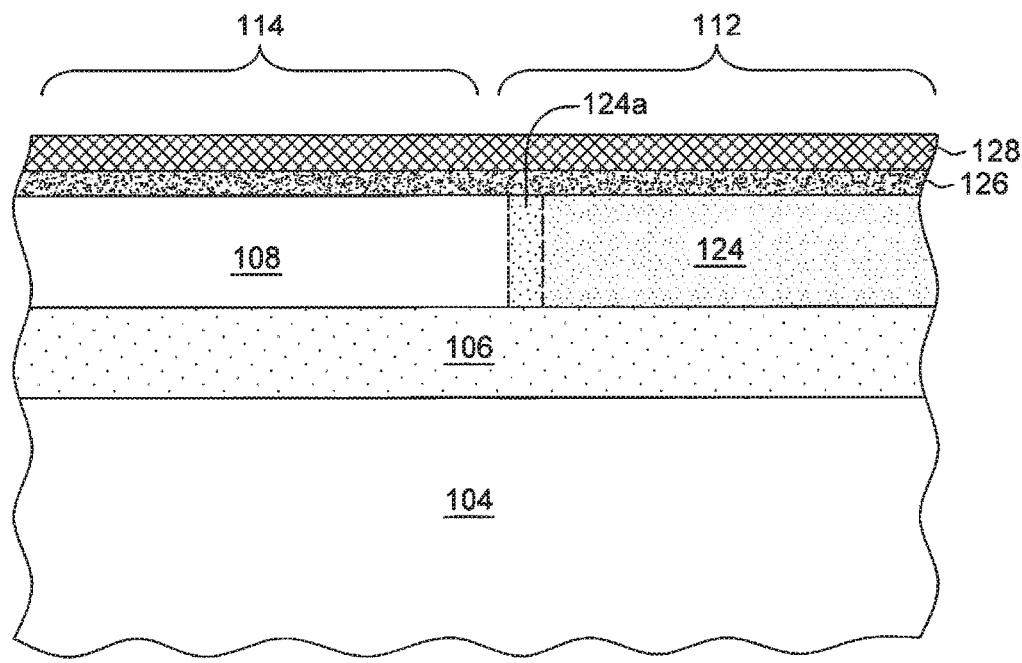
FIG. 1G depicts the structure of FIG. 1F, after providing additional protective hard masks over the first and the second regions of the substrate structure, in accordance with one or more aspects of the present invention.

FIG. 1G depicts the structure of FIG. 1F, after providing one or more protective hard masks 126 and 128 over the unrecessed silicon layer 108 of region 114 and treated semiconductor layer 124 of region 112. As noted, at the processing stage depicted, the one or more protective hard masks include a first hard mask 126 and a second hard mask 128. In one embodiment, first hard mask 126 may be a layer of oxide, such as silicon oxide ($SiO_2$), with a thickness of, for instance, about 10 nm, and may be formed via a chemical vapor deposition process. First hard mask 126 may be protected by a second hard mask 128, and may have an increased hardness relative to the hardness of first hard mask 126. For instance, second hard mask 128 may be a layer of silicon nitride with a thickness of, approximately, 10 nm, and may be formed via, for instance, a chemical vapor deposition process.

Figure 1H:
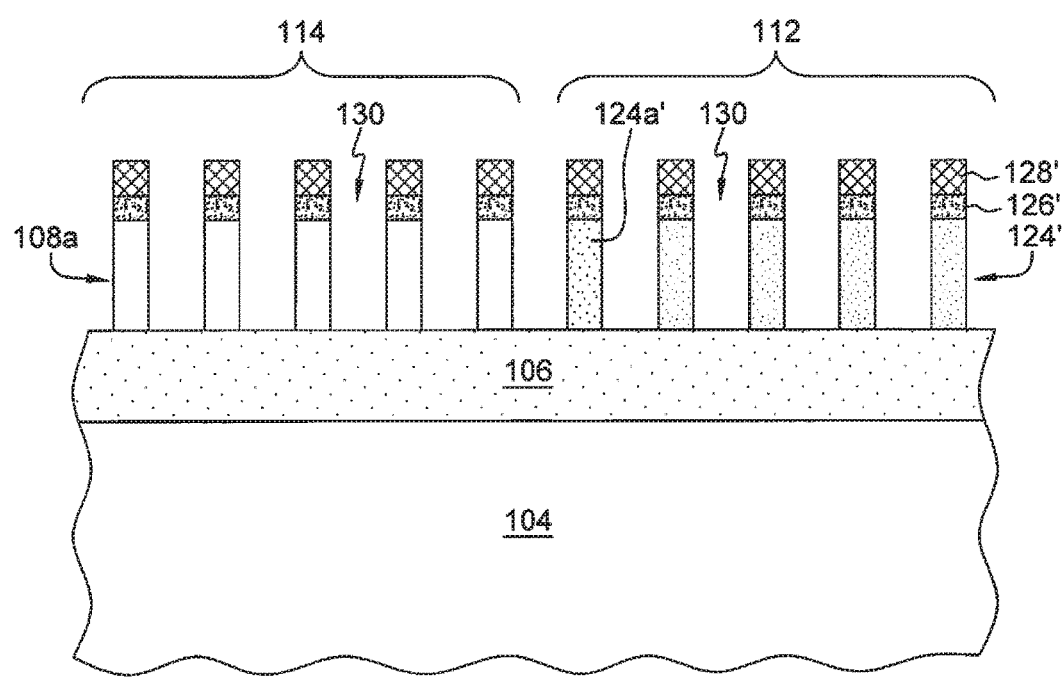
FIG. 1H depicts the resultant structure of FIG. 1G, after patterning to form one or more fin(s) having first conductivity in the first region of the substrate structure and one or more fin(s) having second conductivity in the second region of the substrate structure, in accordance with one or more aspects of the present invention.

FIG. 1H depicts the resultant structure of FIG. 1G, after patterning the unrecessed silicon layer 108 and treated semiconductor layer 124 to form one or more fin(s) 108a extending from substrate structure 102 in region 114 and one or more fin(s) 124' in region 112, respectively. By way of an example, fins may be formed by removing one or more portions of unrecessed silicon layer 108 and treated semiconductor layer 124, creating openings therein. Such removal of the one or more portions defines one or more fins from the same material as the unrecessed silicon layer 108 (for example, a silicon semiconductor material), and treated semiconductor layer 124 (for example, silicon germanium material), respectively. In one example, formation of fins may be achieved by patterning the additional hard mask layers and substrate structure using any of various approaches, including: extreme ultraviolet techniques (EUV), sidewall image transfer (SIT) techniques; direct lithography; litho-etch litho-etch; or litho-etch litho-freeze. Following patterning, removal of the material may be accomplished by performing any suitable etching process such as, for example, anisotropic dry etching process involving, for example, reactive ion etching (RIE) in sulfur hexafluoride ($SF_6$). In one example, the adjacent fins may be separated by a respective opening 130. As noted, the fins 108a in region 114 may be utilized for use in the fabrication of NFET device transistors, and the fins 124' in region 112 may be utilized for use in the fabrication of PFET device transistors. Note that, as depicted, and in one embodiment, the fins 108a in region 114 may have a height that is equal to the fins 124' in region 112.

Further, and in one embodiment, the fins 108a (i.e. silicon fins) extended above the substrate structure 102 in region 114, and fins 124' (i.e. silicon germanium fins) extended above the substrate structure 102 in region 112 have a fin pitch that is dependent, for instance, on a thickness of the protective layer 120 (see FIG. 1E) extended along the sidewall 118 (see FIG. 1C) of the unrecessed silicon layer 108 in region 114. Still further, in one embodiment, the graded protective layer 124a may result in a fin 124a' having a graded germanium concentration. In this embodiment, the concentration of germanium may have a gradient, i.e., the concentration of the germanium which decreases relative to the concentration of germanium present in the remaining silicon germanium fins. Note that, as described above in connection with FIG. 1F, the graded protective layer 124a formed by diffusion of the germanium concentration from semiconductor layer 122 (see FIG. 1E) into the protective layer 120 (see FIG. 1E) minimizes and/or inhibits lateral diffusion of the germanium concentration from the semiconductor layer 122 (see FIG. 1E) into the unrecessed silicon layer 108 in region 114, thereby enabling fin pitch that is suitable for 10 nm and beyond technology nodes. For instance, the uniform fin pitch of the fins 108a in region 114 and fins 124' in region 112 may be within a range of about 5 nm and about 50 nm.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated. Furthermore, a device or structure that is configured in a certain way is configured in at least that way, but may also be configured in ways that are not listed.

What is claimed is:

1. A semiconductor device comprising:
   at least one fin having a first conductivity extended above a first region of a substrate structure, and at least one fin having a second conductivity extended above a second region of the substrate structure, wherein a first fin of the at least one fin having the second conductivity has a graded germanium concentration.

2. The semiconductor device of claim 1, wherein a total height of the at least one fin extended above the first region of the substrate structure is equal to a total height of the at least one fin extended above the second region of the substrate structure.

3. The semiconductor device of claim 1, wherein the at least one fin extended above the first region of the substrate structure comprises a silicon material, and the at least one fin extended above the second region of the substrate structure comprises a silicon germanium material.

4. The semiconductor device of claim 1, wherein the first region of the substrate structure comprises a p-type field-effect transistor (PFET) device region, and the second region of the substrate structure comprises an n-type field-effect transistor (NFET) device region.

5. The semiconductor device of claim 1, wherein a fin pitch of each of the at least one fin of the first region and the at least one fin of the second region is within a range from about 5 nm to about 50 nm.

6. The semiconductor device of claim 1, wherein the concentration of germanium within the first fin of the at least one fin having the second conductivity decreases relative to a concentration of germanium within a second fin of the at least one fin having the second conductivity.

7. The semiconductor device of claim 1, wherein the first fin extended above the second region is laterally adjacent to the at least one fin having a first conductivity extended above the first region.

* * * * *